(12) United States Patent
Oomori et al.

(10) Patent No.: US 6,548,229 B2
(45) Date of Patent: Apr. 15, 2003

(54) POSITIVE-WORKING CHEMICAL-AMPLIFICATION PHOTORESIST COMPOSITION AND METHOD FOR FORMING A RESIST PATTERN USING THE SAME

(75) Inventors: Katsumi Oomori, Chigasaki (JP); Hiroto Yukawa, Yokohama (JP); Ryusuke Uchida, Hillsboro, OR (US); Kazufumi Sato, Sagamihara (JP)

(73) Assignee: Tokyo Ohka Kogyo, Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/903,586

(22) Filed: Jul. 13, 2001

(65) Prior Publication Data

US 2002/0090567 A1 Jul. 11, 2002

Related U.S. Application Data

(62) Division of application No. 09/657,228, filed on Sep. 7, 2000, now Pat. No. 6,284,430, which is a continuation of application No. 09/291,115, filed on Apr. 14, 1999, now abandoned.

(30) Foreign Application Priority Data

Apr. 23, 1998 (JP) .......................................... 10-113587

(51) Int. Cl.$^7$ ................................................ G03F 7/30
(52) U.S. Cl. ..................................... 430/326; 430/270.1
(58) Field of Search ............................. 430/270.1, 326, 430/905

(56) References Cited

U.S. PATENT DOCUMENTS

| | | | |
|---|---|---|---|
| 5,550,008 A | * | 8/1996 | Tomo et al. ................. 430/325 |
| 5,679,495 A | | 10/1997 | Yamachika et al. |
| 5,736,296 A | | 4/1998 | Sato et al. |
| 5,861,231 A | | 1/1999 | Barclay et al. |
| 6,037,107 A | * | 3/2000 | Thackeray et al. ......... 430/326 |
| 6,210,856 B1 | * | 4/2001 | Lin et al. ................. 430/270.1 |

* cited by examiner

*Primary Examiner*—Rosemary Ashton
(74) *Attorney, Agent, or Firm*—Wenderoth, Lind & Ponack, L.L.P.

(57) ABSTRACT

Disclosed is a novel positive-working chemical-amplification photoresist composition capable of giving an extremely finely patterned resist layer in the manufacturing process of semiconductor devices and a method for forming a finely patterned resist layer therewith. The photoresist composition comprises: (A) 100 parts by weight of a copolymeric resin consisting of from 50 to 85% by moles of (a) hydroxyl group-containing styrene units, from 15 to 35% by moles of (b) styrene units and from 2 to 20% by moles of (c) tert-butyl (meth)acrylate units; and (B) from 1 to 20 parts by weight of a radiation-sensitive acid-generating agent which is an onium salt containing a fluoroalkyl sulfonate ion having 1 to 10 carbon atoms as the anion such as diphenyliodonium trifluoromethane sulfonate. In the pattern-forming method with the photoresist composition, the photoresist coating layer is subjected to heat treatments before and after the pattern-wise exposure to light at a relatively low temperature of 100–110 ° C. so that a satisfactory patterning can be accomplished even for an isolated pattern having a line width as small as 0.15 μm.

4 Claims, No Drawings

_US 6,548,229 B2_

POSITIVE-WORKING CHEMICAL-AMPLIFICATION PHOTORESIST COMPOSITION AND METHOD FOR FORMING A RESIST PATTERN USING THE SAME

This is a divisional of Ser. No. 09/657,228, filed Sep. 7, 2000, U.S. Pat. No. 6,284,430 which is a continuation of Ser. No. 09/291,115, filed Apr. 14, 1999, now abandoned.

BACKGROUND OF THE INVENTION

The present invention relates to a novel positive-working chemical-amplification photoresist composition capable of giving a very finely patterned resist layer having an excellently orthogonal cross sectional profile with high photosensitivity and pattern resolution on a substrate surface by patterning exposure using a KrF excimer laser beam and to a method for efficiently forming a very finely patterned resist layer of an isolated pattern having an excellently orthogonal cross sectional profile with fidelity to a photomask pattern by using the above mentioned photoresist composition.

As a trend in the manufacturing technology of semiconductor devices and liquid crystal display panels in recent years, extensive investigations are now under way to establish a photolithographic patterning process of a resist layer having a pattern resolution of as fine as 0.25 $\mu$m or even finer by the use of a positive-working chemical-amplification photoresist composition. Turning now to the problem of the light source for the pattern-wise exposure of the photoresist layer to comply with the requirement in the manufacture of semiconductor devices to accomplish finer and finer patterning, a photolithographic patterning technology for obtaining a patterned resist layer of 0.15 to 0.22 $\mu$m fineness by using a KrF excimer laser beam is the current target of the development works.

With an object to comply with the above mentioned requirements, a proposal is made in Japanese Patent Kokai 7-209868 for a positive-working chemical-amplification photoresist composition containing, as the film-forming resinous ingredient, a copolymeric resin consisting of hydroxyl group-containing styrene units, styrene units and tert-butyl (meth)acrylate units in a molar ratio of 40:20:40 or 33:17:50. The there proposed photoresist composition using a copolymeric resin with a relatively small amount of the hydroxyl group-containing styrene units or a relatively large amount of the tert-butyl (meth)acrylate units is not quite satisfactory when an extremely fine patterned resist layer with 0.15 to 0.22 $\mu$m fineness is formed therewith because the cross sectional profile of the patterned resist layer is not fully orthogonal as desired.

SUMMARY OF THE INVENTION

The present invention accordingly has an object to provide a novel positive-working chemical-amplification photoresist composition capable of giving a finely patterned resist layer with 0.15 to 0.22 $\mu$m fineness and an excellently orthogonal cross sectional profile with high photosensitivity and pattern resolution by the pattern-wise exposure with a KrF excimer laser beam and a method for efficiently forming a very finely patterned resist layer of an isolated pattern with high fidelity to the photomask pattern having an excellently orthogonal cross sectional profile by using the above mentioned photoresist composition.

Thus, the positive-working chemical-amplification photoresist composition provided by the present invention is a uniform blend which comprises, as a solution in an organic solvent:

(A) 100 parts by weight of a copolymeric resin capable of being imparted with increased solubility in an aqueous alkaline solution in the presence of an acid, which consists of from 50 to 85% by moles of hydroxyl group-containing styrene units, from 15 to 35% by moles of styrene units and from 2 to 20% by moles of tert-butyl (meth)acrylate units; and (B) from 1 to 20 parts by weight of a radiation-sensitive acid-generating agent capable of releasing an acid by decomposition under irradiation with actinic rays.

Further, the method for the formation of a patterned resist layer is provided by the present invention which comprises the steps of:

(a) forming, on the surface of a substrate, a layer of the above defined positive-working chemical-amplification photoresist composition;
(b) subjecting the photoresist layer to a first heat treatment at a temperature in the range of from 100° C. to 110° C.;
(c) subjecting the photoresist layer to pattern-wise exposure to actinic rays;
(d) subjecting the photoresist layer to a second heat treatment at a temperature in the range of from 100° C. to 110° C. and
(e) subjecting the photoresist layer to a development treatment with an aqueous alkaline solution.

DETAILED DESCRIPTION OF THE PREFERRED EMBODIMENTS

The film-forming base ingredient as the component (A) in the inventive photoresist composition is a resin capable of being imparted with increased solubility in an aqueous alkaline solution in the presence of an acid, which is a ternary copolymeric resin consisting of three kinds of the monomeric units including (a) from 50 to 85% by moles of hydroxyl group-containing styrene units, (b) from 15 to 35% by moles of styrene units and (c) from 2 to 20% by moles of tert-butyl (meth)acrylate units, the total of the molar fractions of the monomeric units (a), (b) and (c) being 100%. In this ternary copolymeric resin as the component (A), the monomeric unit of the first class (a) is a unit derived from a styrene compound having at least one hydroxyl group bonded to the aromatic nucleus in the molecule in order to impart the copolymeric resin with good solubility in an aqueous alkaline solution as the developer solution. Examples of such a monomeric unit include a hydroxystyrene unit and α-methyl hydroxystyrene unit.

The monomeric unit of the third class (c) in the copolymeric resin is a tert-butyl (meth)acrylate unit, of which the tert-butyl group protects the carboxylic group of (meth)acrylic acid to reduce the solubility of the resin in an aqueous alkaline solution, while this tert-butyl group is eliminated to regenerate the carboxyl group by the interaction with an acid generated from the acid-generating agent as the component (B) when the photoresist layer is exposed pattern-wise to actinic rays resulting in an increase in the solubility of the resin in an aqueous alkaline solution to give a patterned resist layer in the development treatment.

The copolymeric resin as the component (A), which consists of the monomeric units of the three classes (a), (b) and (c) in a specified molar proportion, is advantageous as compared with a resin having solubility-reducing groups introduced into a part of the monomeric units of a polyhydroxystyrene resin in respect of the larger solubility-reducing effect and smaller thickness reduction of the resist layer by a development treatment in the unexposed areas to give a patterned resist layer having an excellently orthogonal cross sectional profile.

In the inventive photoresist composition comprising the copolymeric resinous ingredient as the component (A), which can be either one or a combination of two kinds or more of copolymeric resins falling within the definition of the above described ternary copolymeric resins, it is preferable that the component (A) is a combination of a first copolymeric resin (A1) consisting of from 62 to 68% by moles of the monomeric units of the first class (a), from 15 to 25% by moles of the monomeric units of the second class (b) and from 12 to 18% by moles of the monomeric units of the third class (c) and a second copolymeric resin (A2) consisting of from 62 to 68% by moles of the monomeric units of the first class (a), from 25 to 35% by moles of the monomeric units of the second class (b) and from 2 to 8% by moles of the monomeric units of the third class (c) in a weight proportion in the range from 9:1 to 5:5 or, preferably, from 8:2 to 6:4 in respect of the superiority in the photosensitivity, pattern resolution and orthogonality of the cross sectional profile of the patterned resist layer.

It is preferable that the copolymeric resin as the component (A) has a weight-average molecular weight in the range from 3000 to 30000 as determined by the gel permeation chromatographic (GPC) method by making reference to known polystyrene resins. When the weight-average molecular weight of the component (A) is too low, the photoresist composition cannot be fully film-forming while, when the weight-average molecular weight of the resin is too high, the resin cannot be fully soluble in an aqueous alkaline solution.

The component (B) contained in the inventive photoresist composition in combination with the above described component (A) is a radiation-sensitive acid-generating agent which is a compound capable of releasing an acid by decomposition under irradiation with actinic rays such as ultraviolet light. The acid-generating agent in the inventive photoresist composition is not particularly limitative and can be selected from known ones. It is preferably an onium salt compound containing a fluoroalkyl sulfonate ion of 1 to 10 carbon atoms as the anion.

The cation as the counter ion of the above mentioned anion of the onium salt compound is not particularly limitative and can be selected from known ones. Suitable cations include, for example, phenyl iodonium and sulfonium ions which may optionally be substituted by a lower alkyl group such as methyl, ethyl, propyl, n-butyl and tert-butyl groups or a lower alkoxy group such as methoxy and ethoxy groups.

On the other hand, the anion of the onium salt compound is a fluoroalkyl sulfonate ion obtained by substituting fluorine atoms for a part or all of the hydrogen atoms in an alkyl group of 1 to 10 carbon atoms. It is preferable that the alkyl group in the fluoroalkyl sulfonate ion has 1 to 5 carbon atoms and all of the hydrogen atoms thereof are replaced with fluorine atoms since the acid strength of the sulfonate ion as a sulfonic acid is decreased as the chain length of the alkyl group is increased and the degree of fluorination of the alkyl group is decreased.

Particular examples of the onium salt compounds suitable as the component (B) in the inventive photoresist composition include diphenyl iodonium trifluoromethane or nonafluorobutane sulfonate, bis(4-tert-butylphenyl) iodonium trifluoromethane or nonafluorobutane sulfonate, triphenyl sulfonium trifluoromethane or nonafluorobutane sulfonate and tri(4-methylphenyl) sulfonium trifluoromethane or nonafluorobutane sulfonate. Any of the above named onium salt compounds can be used either singly or as a combination of two kinds or more according to need.

The amount of the onium salt compound as the component (B) in the inventive photoresist composition is in the range from 1 to 20 parts by weight per 100 parts by weight of the component (A). When the amount of the component (B) is too small, good pattern formation can hardly be accomplished while, when the amount of the component (B) is too large, a photoresist composition in the form of a uniform solution cannot be obtained due to the limited solubility of the compound in an organic solvent to cause a decrease in storage stability of the photoresist solution.

While the essential ingredients in the inventive photoresist composition are the above described components (A) and (B), it is optional, if necessary with an object to improve orthogonality of the cross sectional profile of the patterned resist layer and stability of the latent images before development, that the photoresist composition further contains an aliphatic tertiary amine compound as a component (C). Examples of preferable aliphatic tertiary amine compounds include trimethylamine, triethylamine, tripropylamine, tributylamine, tripentylamine, triethanolamine, tributanol amine and the like, of which triethanolamine is particularly preferable although any of these amine compounds can be used either singly or as a combination of two kinds or more according to need.

While additional addition of the above mentioned amine compound to the inventive photoresist composition may eventually have a disadvantageous effect of decreasing the photosensitivity of the composition, this disadvantage can be overcome, along with a beneficial effect of improving the pattern resolution, by the admixture of a carboxylic acid as a component (D) in combination with the component (C). Preferable carboxylic acids suitable for this purpose include aliphatic saturated dicarboxylic acids and aromatic carboxylic acids.

Examples of suitable aliphatic saturated dicarboxylic acids include oxalic, malonic, succinic and glutaric acids. Examples of suitable aromatic carboxylic acids include aromatic mono- and polycarboxylic acids having a hydroxyl or nitro group as a substituent group such as 2-hydroxy benzoic acid, 4-hydroxy benzoic acid, 2-hydroxy-3-nitro benzoic acid, 3,5-dinitro benzoic acid, 2-nitro benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid, 2-vinyl benzoic acid, 4-vinyl benzoic acid, phthalic acid, terephthalic acid and isophthalic acid. These carboxylic acids can be used either singly or as a combination of two kinds or more according to need. Among the above named carboxylic acids, 2-hydroxy benzoic acid, i.e. salicylic acid, and malonic acid are particularly preferable.

As to the amount of the optional component (C) in the inventive photoresist composition, the amine compound is added to the composition in an amount in the range from 0.001 to 10 parts by weight or, preferably, from 0.01 to 1.0 part by weight per 100 parts by weight of the component (A) in consideration of orthogonality of the cross sectional profile of the resist pattern, stability of the latent images before development and photosensitivity of the composition.

The amount of the carboxylic acid as the component (D), when added to the inventive photoresist composition, is in the range from 0.001 to 10 parts by weight or, preferably, from 0.01 to 1.0 part by weight per 100 parts by weight of the component (A). Addition of the component (D) to the inventive photoresist composition has an effect of preventing a decrease in the photosensitivity of the composition as a side effect of the component (C) along with further improvement of orthogonality of the cross sectional profile of the patterned resist layer.

It is usual and advantageous that the positive-working chemical-amplification photoresist composition of the present invention is employed in photolithographic patterning in the form of a uniform solution prepared by dissolving the essential and optional ingredients in an organic solvent. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, dietyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methylpyruvate, ethyl pyruvate, methyl methoxypropionate and ethyl ethoxypropionate, which can be used either singly or as a mixture of two kinds or more according to need.

It is of course optional that the photoresist composition of the invention is further admixed with various kinds of known additives used conventionally in photoresist compositions including auxiliary resins to improve the properties of the resist layer as a film, plasticizers, stabilizers, coloring agents, surface active agents and others each in a limited amount.

The patterns of the photolithographically formed patterned resist layers in the semiconductor technology can be classified into three types including (1) a line-and-space pattern which is an alternate repetition of parallel lines and parallel spaces each having the same width as the others, (2) a hole pattern to form a contact hole and (3) an isolated pattern which is a repetition of lines and spaces, the spaces each having a width larger than the width of each line.

It is extremely difficult in the prior art to accomplish an ultrafinely patterned resist layer including the above mentioned three types of patterns (1), (2) and (3) simultaneously with fineness of 0.15 to 0.22 μm so that it is becoming more and more important to develop a photoresist composition to meet the requirements in the respective applications. Under these circumstances, the present invention provides a positive-working photoresist composition capable of particularly satisfying the requirements for patterning of a line-and-space pattern and a hole pattern having fineness of 0.20 to 0.22 μm.

When the desired resist pattern is a hole pattern, in particular, it is advantageous that the photoresist composition is admixed with dimethylacetamide in an amount of 0.1 to 5.0 parts by weight based on the amount of the component (A).

When an isolated pattern of a fineness of about 0.15 μm is desired of the patterned resist layer, an unexpected discovery has been obtained that the pattern resolution and focusing depth latitude can be greatly improved by the admixture of the inventive photoresist composition with a benzophenone compound as a component (E). Because of the extreme fineness of the desired isolated pattern, the patterned resist layer is sometimes liable to a trouble of pattern falling if the cross sectional profile of the patterned resist layer is not exactly orthogonal but has an inversely trapezoidal profile with the top width larger than the bottom width. The mechanism of the advantageous effects obtained by the addition of a benzophenone compound is presumably because the transparency of the photoresist layer to the exposure light is adequately decreased due to the large absorptivity of the benzophenone compound to the exposure light leading to an improvement in the pattern resolution and focusing depth latitude. Although any benzophenone compounds having a high absorption coefficient to the exposure light can be used as the component (E), benzophenone and Michler's ketone, i.e. 4,4'-bis-(dimethylamino) benzophenone, are preferable because of the absence of a phenolic hydroxyl group in these compounds since a benzophenone compound having a hydroxyl group has relatively high solubility in an aqueous alkaline solution so as to cause undesirable film thickness reduction in the development treatment. The amount of the benzophenone compound in the inventive photoresist composition, if added, is in the range from 0.1 to 5.0 parts by weight or, preferably, from 0.5 to 2.0 parts by weight per 100 parts by weight of the component (A).

In view of the relatively low susceptibility of the tert-butyl groups protecting the copolymeric resin as the component (A) to elimination in the presence of an acid, at least either of the pre-exposure baking treatment, i.e. a first heat treatment after coating of a substrate surface with the photoresist solution to effect drying, and the post-exposure baking treatment, i.e. a second heat treatment, after pattern-wise exposure of the photoresist layer to light, is conducted usually at a temperature of 130° C. or higher. In the formation of a patterned resist layer of an isolated pattern, in contrast thereto, an excellently patterned resist layer can be obtained by conducting each of the baking treatments at a lower temperature in the range from 100 to 110° C.

The general procedure of the photolithographic patterning work by using the inventive photoresist composition is not particularly different from conventional procedures known in the technology of photolithography. It is advantageous that the surface of the substrate such as a semiconductor silicon wafer is subjected beforehand to a treatment with hexamethyl disilazane and the like to improve adhesion of the resist layer to the substrate surface. The photoresist composition in the form of a solution is uniformly applied to the substrate surface on a coating machine such as a spinner followed by a first heat treatment to effect drying of the coating layer at a temperature in the range from 100 to 110° C. for 30 to 150 seconds or, preferably, for 60 to 120 seconds to form a dried photoresist layer which is pattern-wise exposed to actinic rays such as KrF excimer laser beams through a photomask bearing a desired pattern, for example, on a minifying projection exposure machine followed by a post-exposure baking treatment at a temperature in the range from 100 to 110° C. for 30 to 150 seconds or, preferably, for 60 to 120 seconds to form a latent image of the pattern.

Development of the latent image is performed by using an aqueous alkaline solution such as a 1 to 10% by weight aqueous solution of tetramethylammonium hydroxide. In this way, an extremely fine patterned resist layer in an isolated pattern having high fidelity to the photomask pattern can be formed on the substrate surface with fineness of 0.15 to 0.22 μm and a cross sectional profile of good orthogonality.

Although most satisfactory results of resist patterning with the inventive photoresist composition can be accomplished by using a KrF excimer laser beam as the actinic rays for pattern-wise exposure, electron beams and X-rays can also be used for the photolithographic patterning with the inventive photoresist composition.

In the following, the positive-working chemical-amplification photoresist composition of the present invention and the method for forming a resist pattern by using the photoresist composition are described in more detail by way of Examples, which, however, never limit the scope of the invention in any way. In the following description, the term of "parts" always refers to "parts by weight".

EXAMPLE 1

A positive-working photoresist composition was prepared by uniformly dissolving, in 800 parts of propyleneglycol monoethyl ether acetate, 60 parts of a first copolymeric resin, referred to as the resin I hereinafter, having a weight-average molecular weight of 10,000 and consisting of 65% by moles of hydroxystyrene units, 20% by moles of styrene units and 15% by moles of tert-butyl acrylate units, 40 parts of a second copolymeric resin, referred to as the resin II hereinafter, having a weight-average molecular weight of 10,000 and consisting of 65% by moles of hydroxystyrene units, 30% by moles of styrene units and 5% by moles of tert-butyl acrylate units, 3.2 parts of diphenyl iodonium trifluoromethane sulfonate,
0.50 part of triethanolamine,
0.47 part of salicylic acid, and
3.6 parts of benzophenone,
followed by filtration of the solution through a membrane filter of 0.2 μm pore diameter.

A semiconductor silicon wafer of 6 inches diameter after a treatment with hexamethyl disilazane was coated on a spinner with the above prepared photoresist solution followed by drying under heating on a hot plate at 100° C. for 90 seconds to give a dried photoresist layer having a thickness of 0.7 μm. In the next place, the photoresist layer was exposed pattern-wise to a KrF excimer laser beam on a minifying projection exposure machine (Model FPA-3000EX3, manufactured by Canon Co.) through a photomask bearing an isolated pattern followed by a post-exposure baking treatment at 100° C. for 90 seconds and then by a puddle development treatment at 23° C. for 65 seconds in a 2.38% by weight aqueous solution of tetramethylammonium hydroxide to give a positively patterned resist layer.

A fully resolved isolated resist pattern of 0.15 μm line width could be obtained in this way. The thus patterned resist layer had an excellently orthogonal cross sectional profile standing upright on the substrate surface. The minimum exposure dose for obtaining the isolated resist pattern of 0.15 μm width was 35 mJ/cm² as a measure of the photosensitivity.

EXAMPLE 2

A line-and-space patterned resist layer was formed on a silicon wafer substrate in about the same experimental procedure as in Example 1 excepting for modification of the formulation of the photoresist composition by replacing 3.2 parts of diphenyl iodonium trifluoromethane sulfonate with 3.0 parts of triphenylsulfonium trifluoromethane sulfonate and omitting benzophenone and for modification of the heat treatment conditions by undertaking the first heat treatment at 130° C. for 90 seconds and the post-exposure baking treatment at 110° C. for 90 seconds.

The results of the evaluation tests of the patterned resist layer were that a fully resolved line-and-space pattern of 0.22 μm line width could be obtained in this way. The thus patterned resist layer had an excellently orthogonal cross sectional profile standing upright on the substrate surface. The minimum exposure dose for obtaining the line-and-space resist pattern of 0.22 μm width was 30 mJ/cm² as a measure of the photosensitivity.

EXAMPLE 3

A patterned resist layer involving a hole pattern was formed on a silicon wafer substrate in about the same experimental procedure as in Example 2 excepting for modification of the formulation of the photoresist composition by additionally admixing the composition with 2 parts of N,N-dimethylacetamide and modification of the heat treatment conditions by undertaking the first heat treatment at 140° C. for 90 seconds and the post-exposure baking treatment at 130° C. for 90 seconds.

The results of the evaluation tests of the patterned resist layer were that a hole pattern of 0.22 μm diameter could be obtained in this way. The thus formed hole-patterned resist layer had an excellent cross sectional profile perpendicularly reaching the substrate surface. The minimum exposure dose for obtaining the hole pattern of 0.22 μm diameter was 40 mJ/cm² as a measure of the photosensitivity.

COMPARATIVE EXAMPLE 1

The experimental procedure was substantially the same as in Example 1 excepting for modification of the formulation of the photoresist composition by replacing the combination of 60 parts of the resin I and 40 parts of the resin II with 100 parts of a third copolymeric resin having a weight-average molecular weight of 10,000 and consisting of 55% by moles of hydroxystyrene units, 20% by moles of styrene units and 25% by moles of tert-butyl acrylate units.

The results of the evaluation tests of the patterned resist layer were that isolated patterns of a line width smaller than 0.20 μm could not be obtained and the cross sectional profile of the line pattern of 0.20 μm width was inversely trapezoidal. The minimum exposure dose for obtaining the isolated pattern of 0.20 μm line width was 35 mJ/cm².

COMPARATIVE EXAMPLE 2

The experimental procedure was substantially the same as in Example 1 excepting for modification of the formulation of the photoresist composition by replacing the combination of 60 parts of the resin I and 40 parts of the resin II with 100 parts of a fourth copolymeric resin having a weight-average molecular weight of 10,000 and consisting of 40% by moles of hydroxystyrene units, 20% by moles of styrene units and 40% by moles of tert-butyl acrylate units.

The results of the evaluation tests of the patterned resist layer were that isolated patterns of a line width smaller than 0.30 μm could not be obtained and the cross sectional profile of the line pattern of 0.30 μm width was inversely trapezoidal. The minimum exposure dose for obtaining the isolated pattern of 0.30 μm line width was 35 mJ/cm².

COMPARATIVE EXAMPLE 3

The experimental procedure was substantially the same as in Example 1 excepting for modification of the formulation of the photoresist composition by replacing the combination of 60 parts of the resin I and 40 parts of the resin II with 100 parts of a fifth copolymeric resin having a weight-average molecular weight of 10,000 and consisting of 78% by moles of hydroxystyrene units, 20% by moles of styrene units and 2% by moles of tert-butyl acrylate units.

The results of the evaluation tests of the patterned resist layer were that isolated patterns of a line width smaller than 0.25 μm could not be obtained and the cross sectional profile of the line pattern of 0.25 μm width was trapezoidal. The minimum exposure dose for obtaining the isolated pattern of 0.25 μm line width was 40 mJ/cm².

What is claimed is:

1. A method for the formation of an isolated patterned resist layer which comprises the steps of:
   (a) forming, on the surface of a substrate, a layer of a positive-working chemical-amplification photoresist composition which comprises, as a uniform blend:
      (A) 100 parts by weight of a copolymeric resin capable of being imparted with an increased solubility in an aqueous alkaline solution in the presence of an acid and consisting of from 50 to 85% by moles of hydroxyl group-containing styrene units, from 15 to 35% by moles of styrene units and from 2 to 20% by moles of tert-butyl acrylate or methacrylate units; and
      (B) from 1 to 20 parts by weight of a radiation-sensitive acid-generating agent releasing an acid by decomposition under irradiation with actinic rays;
   (b) subjecting the photoresist layer to a first heat treatment at a temperature in the range from 100° C. to 110° C.;
   (c) subjecting the photoresist layer to patternwise exposure to actinic rays;
   (d) subjecting the photoresist layer to a second heat treatment at a temperature in the range from 100° C. to 110° C.; and
   (e) subjecting the photoresist layer to a development treatment.

2. The method for the formation of a patterned resist layer as claimed in claim 1 in which each of the first and second heat treatments is conducted for a length of time in the range from 30 to 150 seconds.

3. The method for the formation of a patterned resist layer as claimed in claim 2 in which each of the first and second heat treatments is conducted for a length of time in the range from 60 to 120 seconds.

4. The chemical-amplification photoresist composition as claimed in claim 1 in which the copolymerization ratios of the comonomers for the copolymeric resin (A) are in the ranges of 62 to 68% by moles of hydroxystyrene, 15 to 25% by moles of styrene and 12 to 18% by moles of tert-butyl acrylate or methacrylate.

* * * * *